(12) United States Patent
Tsuji et al.

(10) Patent No.: US 8,907,226 B2
(45) Date of Patent: Dec. 9, 2014

(54) CONDUCTOR FOR FLEXIBLE SUBSTRATE AND FABRICATION METHOD OF SAME, AND FLEXIBLE SUBSTRATE USING SAME

(75) Inventors: Takayuki Tsuji, Hitachi (JP); Toshiyuki Horikoshi, Hitachi (JP); Masato Ito, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 907 days.

(21) Appl. No.: 12/045,727

(22) Filed: Mar. 11, 2008

(65) Prior Publication Data

US 2009/0229865 A1 Sep. 17, 2009

(51) Int. Cl.
| | |
|---|---|
| H05K 1/03 | (2006.01) |
| H05K 1/09 | (2006.01) |
| C25D 11/02 | (2006.01) |
| H05K 3/24 | (2006.01) |
| H05K 1/11 | (2006.01) |

(52) U.S. Cl.
CPC .......... *H05K 3/24* (2013.01); *H05K 2203/0315* (2013.01); *H05K 2201/0769* (2013.01); *H05K 2201/0326* (2013.01); *H05K 1/118* (2013.01)
USPC .......................................... 174/256; 428/629

(58) Field of Classification Search
USPC .................... 174/256; 428/629, 640
See application file for complete search history.

(56) References Cited

U.S. PATENT DOCUMENTS

| | | | | |
|---|---|---|---|---|
| 5,028,492 A | * | 7/1991 | Guenin | 428/614 |
| 5,209,987 A | * | 5/1993 | Penneck et al. | 428/610 |
| 5,491,035 A | * | 2/1996 | Carey et al. | 428/647 |
| 6,136,460 A | * | 10/2000 | Chen et al. | 428/699 |
| 6,312,762 B1 | * | 11/2001 | Sugawara et al. | 427/376.2 |
| 6,667,629 B2 | * | 12/2003 | Souza et al. | 324/755.01 |
| 6,720,499 B2 | * | 4/2004 | Bokisa et al. | 174/257 |
| 6,770,383 B2 | * | 8/2004 | Tanaka et al. | 428/646 |
| 7,029,760 B2 | * | 4/2006 | Mori et al. | 428/600 |
| 7,154,044 B2 | * | 12/2006 | Horikoshi et al. | 174/126.1 |
| 2002/0071961 A1 | * | 6/2002 | Miura | 428/544 |

(Continued)

FOREIGN PATENT DOCUMENTS

| | | |
|---|---|---|
| CN | 101096730 A | 1/2008 |
| JP | 2005-206869 | 8/2005 |

(Continued)

OTHER PUBLICATIONS

Reference for JEITA'S 2005 Lead Free Achievement Urgent Proposal meeting, Feb. 17, 2005, JEITA Technical Standardization Committee on Connecting Components, PG on Whisker Test Method for Connectors, pp. 1-10.

(Continued)

*Primary Examiner* — Chau N Nguyen
*Assistant Examiner* — Roshn Varghese
(74) *Attorney, Agent, or Firm* — Antonelli,, Terry, Stout & Kraus, LLP.

(57) ABSTRACT

A conductor for a flexible substrate, used for a flexible flat cable or disposed inside a flexible printed-circuit board, according to the present invention comprises: a base conductor made of Cu or Cu-alloy; a plating film made of Sn or Sn-alloy formed on a surface of the base conductor; and a surface oxide film formed on a surface of the plating film, in which the surface oxide film includes oxide of an element other than Sn or a mixture of Sn oxide and oxide of an element other than Sn.

20 Claims, 4 Drawing Sheets

(56) References Cited

U.S. PATENT DOCUMENTS

| | | | |
|---|---|---|---|
| 2003/0044597 A1* | 3/2003 | Nagai et al. | 428/336 |
| 2004/0219384 A1* | 11/2004 | Cooper et al. | 428/646 |
| 2005/0211461 A1 | 9/2005 | Horikoshi et al. | |
| 2007/0295528 A1 | 12/2007 | Nishi et al. | |

FOREIGN PATENT DOCUMENTS

| | | | | |
|---|---|---|---|---|
| JP | 2005-216749 | | 8/2005 | |
| JP | 2005216749 A | * | 8/2005 | H01B 7/08 |
| JP | 2006-045665 | | 2/2006 | |
| JP | 2006-111898 | | 4/2006 | |
| JP | 2006111898 A | * | 4/2006 | |
| JP | 2006-161146 | | 6/2006 | |
| JP | 2006161146 A | * | 6/2006 | |
| JP | 2006-196323 | | 7/2006 | |
| JP | 2006196323 A | * | 7/2006 | |
| JP | 2006-111898 | | 10/2006 | |

OTHER PUBLICATIONS

Reference for JEITA'S 2005 Research Report About Practical Application of Lead-Free Soldering, JAE Connector Div. Proprietary, Japan Aviation Electronics Industry, Ltd., Jun. 2005.

Clarification and Countermeasures for Tin Whisker Growth Process Lecture 1, Historical Background and Recent Topics, 40257US_NT3358US, pp. 1-3.

Chinese Office Action dated Sep. 21, 2010, and partial English translation thereof.

Office Action of Appln. No. 2006-288155 dated Jul. 14, 2009 with English translation.

* cited by examiner (a)

(b)

(a)

(b)

CONDUCTOR FOR FLEXIBLE SUBSTRATE AND FABRICATION METHOD OF SAME, AND FLEXIBLE SUBSTRATE USING SAME

BACKGROUND OF THE INVENTION

1. Field of the Invention

The present invention relates to a conductor for wiring and terminal connection, and in particular, relates to a conductor used for a flexible substrate, such as a flexible flat cable (FFC) and flexible printed-wiring board (FPC), used for electronic devices and a fabrication method of the conductor. Furthermore, the present invention relates to a flexible substrate using the conductor.

2. Description of Related Art

FIG. 2 is a schematic illustration showing a perspective view of an example of a joint between a connector and a flexible flat cable. As shown in FIG. 2, in a terminal connection at which a flexible flat cable (hereafter, referred to as FFC) 13 is connected to a connector 11, plating is applied to a surface of a connector pin (metal terminal) 12 of the connector (connector member) 11 and a conductor 14 of the FFC 13. Conventionally, Sn (tin), Ag (silver), Au (gold) or Ni (nickel) plating is applied to a surface of wiring material, specifically copper and copper alloy, in order to prevent the wiring material from oxidizing. Especially, the cost of raw material for Sn is low, and Sn is soft. Therefore, Sn is easily deformed by pressure at a contact point, increasing a contact area, and thereby making it possible to keep the contact resistance low. For this reason, wiring material with its surface plated with Sn is widely used.

An Sn—Pb alloy having a good resistance to whiskers has been conventionally used as an Sn plating alloy. However, recently, from the viewpoint of environmental considerations, the use of Pb-free material (lead-free material) and non-halogen material are desired. Therefore, it is required that material used as wiring material be Pb-free and non-halogen, and a variety of research and development have been carried out. (For example, JP-A-2006-111898, JP-A-2005-216749, JP-A-2005-206869, JP-A-2006-45665, Reference for JEITA's lead-free achievement urgent proposal meeting (2005.2.17), and JEITA's 2005 research report about practical application of lead-free soldering (2005.6))

However, there is a problem with the development of Pb-free technology of the Sn plating, specifically in the Sn or Sn-group alloy plating. FIG. 3 is a schematic illustration showing an enlarged perspective view for explaining appearance (growth) of whiskers on the joint between the connector and the FFC. As shown in FIG. 3, whiskers 21 that are acicular crystals of Sn appear (grow) from the plating, thereby causing short-circuits between adjacent conductors.

It is considered possible to reduce appearance (growth) of whiskers by executing the reflow process of electroplated Sn so as to reduce a residual stress in the Sn plating which is considered one of the causes for the appearance (growth) of whiskers. However, a detailed mechanism to inhibit whiskers has not yet been clarified. Furthermore, in the cases in which external stress is newly applied to the contact point in the joint of the connector or the like after the reflow process, the application of the reflow process before the joint will not be helpful to inhibit the appearance of whiskers. On the other hand, although it is possible to suppress whiskers by applying Bi (bismuth) or Ag alloy electrolytic plating or electroless plating, there is a report indicating that the application of the reflow process may cause whiskers to appear more frequently than in the case of the pure Sn plating. Besides, it is assumed that the reflow process is a necessary process for electronic components in order to mount components, therefore, creating a problem with the use of this alloy (Bi or Ag alloy) plating.

Currently, an effective method is disclosed in which thin Sn plating with the thickness of 1 μm or less is applied. However, in this method, there is a problem in that contact resistance increases more than in the conventional technological methods, specifically when the plating is left under high temperatures.

SUMMARY OF THE INVENTION

Under these circumstances, the present invention is originated to solve the above problems. It is an objective of the present invention to provide a conductor for a flexible substrate and a flexible substrate using the conductor, wherein there is an unlikely or almost no possibility of the appearance (growth) of whiskers from the surface of the Sn plating film or from the soldering portion around the conductor. Furthermore, it is an objective of the present invention to provide a fabrication method of the conductor.

(1) According to one aspect of the present invention, a conductor for a flexible substrate, used for a flexible flat cable or disposed inside a flexible printed-circuit board, comprises: a base conductor made of Cu or Cu-alloy; a plating film made of Sn or Sn-alloy formed on a surface of the base conductor; and a surface oxide film formed on a surface of the plating film, wherein the surface oxide film includes oxide of an element other than Sn or a mixture of Sn oxide and oxide of an element other than Sn.

In the above invention (1), the following modifications and changes can be made.

(i) The element other than Sn has higher oxidative tendency than Sn. Herein, it is defined that the element having high oxidative tendency indicates an element whose standard free energy for formation of oxide is smaller than that of Sn (negative value with large absolute value); e.g., Zn (zinc), P (phosphorus), Al (aluminum), and Ti (titanium).

(ii) The element other than Sn is at least one kind of element chosen from among Zn, P, Al, and Ti.

(iii) A thickness of the surface oxide film, including oxide of an element other than Sn or a mixture of Sn oxide and oxide of an element other than Sn, is equal to or less than 5 nm.

(iv) A flexible substrate comprises a plurality of said conductors arranged in parallel and an insulating layer provided on both sides of the plurality of conductors.

(v) The insulating layer is made of resin film material having an adhesive layer at least on one side.

(2) According to another aspect of the present invention, a fabrication method of a conductor for a flexible substrate, used for a flexible flat cable or disposed inside a flexible printed-circuit board, comprises steps of: is characterized in that forming a plating film made of Sn or Sn-alloy on a surface of a base conductor made of Cu or Cu-alloy; forming another plating layer made of at least one kind of element selected from among Zn and P is formed on a surface of the plating film; and subsequently oxidizing at least the another plating layer by means of the reflow process, thereby forming a surface oxide film made of oxide of the selected element or a mixture of Sn oxide and oxide of the selected element.

(3) According to another aspect of the present invention, a fabrication method of a conductor for a flexible substrate, used for a flexible flat cable or disposed inside a flexible printed-circuit board, comprises steps of: forming an Sn-alloy plating film containing at least one kind of element selected from among Zn, P, Al, and Ti on a surface of a base conductor made of Cu or Cu-alloy; and subsequently oxidizing a surface region of the Sn-alloy plating film by means of a reflow process, thereby forming a surface oxide film made of oxide of the selected element or a mixture of Sn oxide and oxide of the selected element.

Advantages of the Invention

A conductor for a flexible substrate according to the present invention, in a flexible flat cable and a flexible printed-wiring board, is possible to inhibit whiskers, which are acicular crystals of Sn, even in a location such as a joint to which external stress is applied, thereby making it possible to solve problems such as short-circuits between adjacent conductors. Furthermore, a conductor for a flexible substrate according to the present invention is able to maintain contact reliability (small contact resistance) even under high-temperature environment.

DETAILED DESCRIPTION OF THE PREFERRED EMBODIMENTS

Hereafter, a preferred embodiment of the present invention will be described with reference to the attached drawings. However, the present invention is not limited to the embodiments described herein.

A conventional Sn-plated conductor is normally covered with only a film of Sn oxide. On the contrary, in order to achieve the above-mentioned objective, a surface region of a conductor according to the present invention is made of other oxide film including oxide of an element other than Sn or a mixture of Sn oxide with oxide of an element other than Sn. Elements other than Sn include, e.g., Zn, P, Al, and Ti.

Figure 1A:
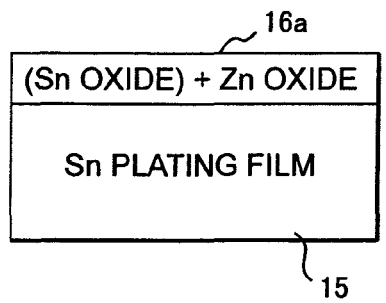
FIG. 1(A) is a schematic illustrations showing a cross sectional view of an example of a conductor according to an embodiment of the present invention.
Figure 1B:
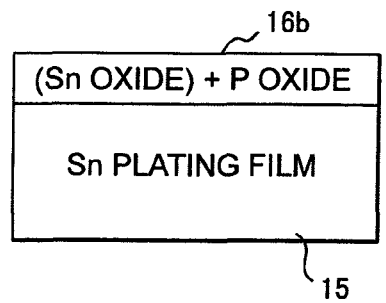
FIG. 1(B) is a schematic illustrations showing a cross sectional view of another example of a conductor according to an embodiment of the present invention.
Figure 2:
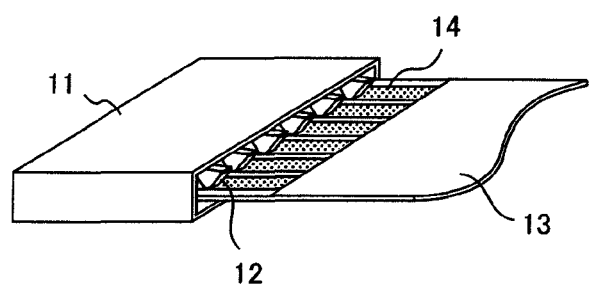
FIG. 2 is a schematic illustration showing a perspective view of an example of a joint between a connector and FFC.
Figure 3:
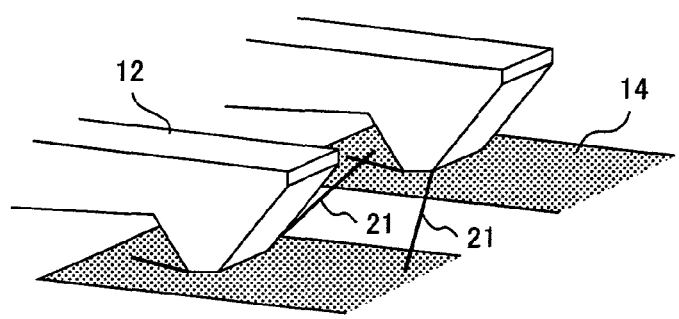
FIG. 3 is a schematic illustration showing an enlarged perspective view for explaining appearance (growth) of whiskers on the joint between the connector and the FFC, causing a short-circuit between adjacent conductors.

FIG. 1(A) is a schematic illustrations showing a cross sectional view of an example of a conductor according to an embodiment of the present invention. FIG. 1(B) is a schematic illustrations showing a cross sectional view of another example of a conductor according to an embodiment of the present invention. As shown in FIG. 1(A), Sn or Sn-alloy plating film 15 is formed on a surface or periphery of a base conductor (not shown) made of Cu or Cu-alloy; and surface oxide film 16a made of Zn oxide, or a mixture of Sn oxide and Zn oxide is formed on a surface of the Sn or Sn-alloy plating film 15. Furthermore, as shown FIG. 1(b), surface oxide film 16b made of P oxide or a mixture of Sn oxide and P oxide is formed on the surface of the Sn or Sn-alloy plating film 15.

For formation of the surface oxide film 16a, 16b, it is possible to apply Zn, P, Al or Ti plating on the surface of the Sn or Sn-alloy plating film 15, and then to oxidize the plating. Alternatively, it is possible to add elements of the Zn, P, Al or Ti to the Sn and to plate the conductor with those elements for forming the Sn-alloy plating film 15 and then to oxidize the surface region in order to form surface oxide film 16a, 16b which includes Zn, P, Al or Ti.

Normally, it is said that when stress is applied to the Sn plating, a defect on a surface of the Sn oxide film acts as a nucleus for the appearance of whiskers from where the whiskers grow. (Reference: "Clarification and Countermeasures for Tin Whisker Growth Process" by R&D Planning Corporation) In JP-A-2006-111898, a method is disclosed in which the Sn plating film is oxidized to form thick and dense Sn oxide or hydroxide film and defects of the surface are reduced thereby inhibiting whiskers from appearing. However, in the cases in which Sn plating film greatly deforms at the contact point of the connector or the like, it is not possible to prevent the occurrence of a defect on the surface oxide film. Furthermore, it is not preferable to form thick oxide film on the surface because contact resistance will increase.

As a result of the research which we current inventors have devoted ourselves to, our findings indicate that it is possible to change the properties of conventional oxide film made of only Sn oxide by forming of at least one kind of oxide from among Zn, P, Al, and Ti on the surface, thereby making it possible to reduce the frequency of whiskers from appearing. It was also found that as the oxide becomes thicker, the appearance frequency of whiskers at the joint of the connector increases.

Accordingly, the inventors applied 8 to 10 μm thickness Sn plating film, which included a variety of concentrated Zn, P, Al and Ti on the rectangular copper wire by the hot-dip plating. Type of the surface oxide was investigated by XPS analysis (X-ray Photoelectron Spectroscopy) and the thickness of the oxide film by AES depth direction analysis (Auger Electron Spectroscopy). Furthermore, the inventors joined each specimen to a connector, left the specimens under room temperature for two weeks, removed them from each connector, observed the joints by SEM (Scanning Electron Microscopy), and measured the appearance frequency of a whisker having a length of 10 μm or more. Here, each specimen to be joined to a connector was formed into an FFC, which had 50 pins in a row with 0.5-mm pitch (described later in detail). And, the appearance frequency of whiskers was calculated from the following equation. "(Appearance frequency of whiskers) (%)=100×(number of pins recognizing whiskers)/(total number of pins observed)."

Table 1 lists the individual data.

TABLE 1

| Specimen | Additive metal | Configuration of surface oxide film (by XPS analysis) | Thickness of surface oxide film (by AES analysis) | Appearance frequency of whiskers |
| --- | --- | --- | --- | --- |
| 1 | None | Sn oxide | 2.5 nm | 47% |
| 2 | Zn | Zn oxide | 2.5 nm | 29% |
| 3 | Zn | Zn oxide | 3 nm | 40% |
| 4 | Zn | Zn oxide | 4 nm | 44% |
| 5 | Zn | Zn oxide | 6 nm | 55% |
| 6 | P | Sn oxide, P oxide | 2.5 nm | 21% |

TABLE 1-continued

| Specimen | Additive metal | Configuration of surface oxide film (by XPS analysis) | Thickness of surface oxide film (by AES analysis) | Appearance frequency of whiskers |
|---|---|---|---|---|
| 7 | Al | Al oxide | 3 nm | 40% |
| 8 | Ti | Ti oxide | 3 nm | 40% |

When compared with specimen No. 1 whose surface oxide film was made of only Sn oxide, specimens Nos. 2 to 4 whose surface oxide film was made of Zn oxide, specimen No. 6 whose surface oxide film was made of a mixture of Sn oxide and P oxide, specimen No. 7 whose surface oxide film was made of Al oxide, and specimen No. 8 whose surface oxide film was made of Ti oxide were all able to reduce the appearance frequency of whiskers. Thus, as the result of above comparison with the surface made of only Sn oxide, it was verified that the appearance frequency of whiskers could be inhibited by using oxide of an element other than Sn or mixing Sn oxide with oxide of an element other than Sn.

Furthermore, according to the results of specimen No. 5, it was revealed that even when oxide of an element other than Sn was used for the surface oxide film, if the film was too thick, a whisker inhibiting effect could not be obtained. Therefore, a thickness of the surface oxide film is preferably equal to or less than 5 nm, more preferably equal to or less than 3 nm.

Since the Zn, P, Al, and Ti tend to be oxidized more than the Sn, their oxides can be naturally formed by adding those elements to the Sn plating and by thermally treating them. Thus, it is possible to change the properties of the Sn-plated surface oxide film. As a method of adding Zn, as disclosed in JP-A-2005-216749, there is a method in which Zn plating is applied on the periphery of the Sn plating and then thermal treatment is applied. At this time, by changing the thickness of the Zn plating, it is possible to change the thickness of the surface oxide film.

EXAMPLES

Example 1

The 5-μm-thick Sn plating film was applied to the periphery of the 0.6-mm-diameter copper wire by electroplating, and then the 0.5-μm-thick Zn was applied to that periphery by flash plating. Subsequently, the cold wire drawing and cold rolling processes were executed, and a 0.05-mm-thick and 0.3-mm-wide rectangular wire was made. Thereafter, the reflow process was applied by using an energizing annealer. Finally, 50 pieces of conductors were arranged in a row with 0.5-mm pitch, and both sides were laminated with polyester film having a polyester-group adhesive layer on one side, thereby making an FFC.

Comparative Example 1

The 5-μm-thick Sn plating film was applied to the periphery of the 0.6-mm-diameter copper wire by electroplating. Subsequently, the cold wire drawing and cold rolling processes were executed, and a 0.05-mm-thick and 0.3-mm-wide rectangular wire was made. After that, an FFC was made by the same procedures and under the same conditions as Example 1 of the present invention.

Figure 4:
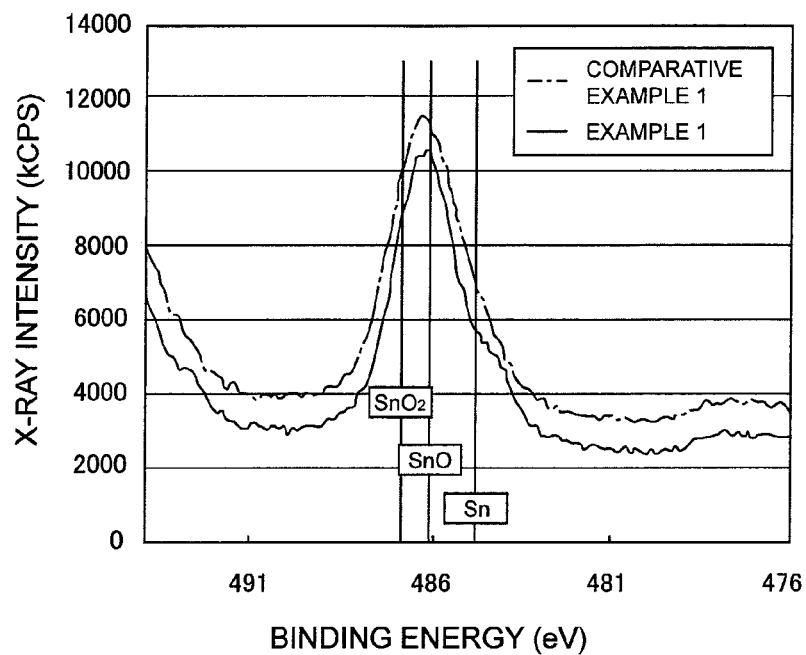
FIG. 4 shows results of XPS (X-ray photoelectron spectroscopy) analysis to identify Sn surface oxide films according to Example 1 of the present invention and Comparative example 1.
Figure 5:
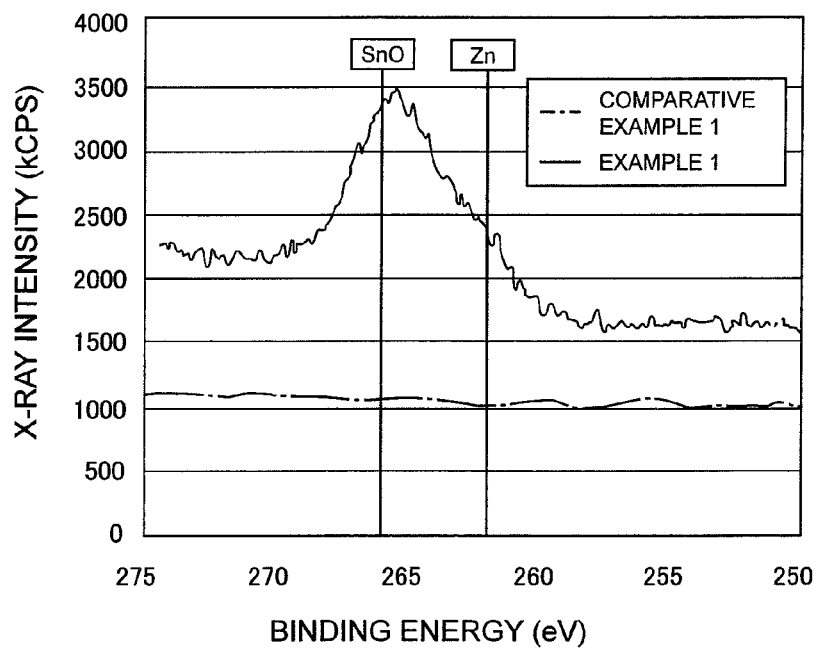
FIG. 5 shows results of XPS analysis to identify Zn surface oxide films according to Example 1 of the present invention and Comparative example 1.

The XPS analysis of the Sn-plated conductor in the terminal area of each FFC made of Example 1 according to the present invention and Comparative example 1 was carried out. The results of the analysis of the surface oxide film are shown in FIGS. 4 and 5. FIG. 4 shows results of XPS analysis to identify Sn surface oxide films according to Example 1 of the present invention and Comparative example 1. FIG. 5 shows results of XPS analysis to identify Zn surface oxide films according to Example 1 of the present invention and Comparative example 1.

As shown in FIG. 4, in both cases of Example 1 and Comparative example 1, the peak of the X-ray intensity (kCPS: kilo-counts per second) was recognized at the binding energy of 486 and 487 eV; thus, it was verified that SnO (tin(II) oxide) and $SnO_2$ (tin(IV) oxide) were formed. Furthermore, as shown in FIG. 5, in Example 1 according to the present invention, the peak of the X-ray intensity of Zn was recognized at the binding energy of 262 eV, and it was verified that ZnO (zinc oxide) was formed. However, the peak of Zn or ZnO was not verified in Comparative example 1. Accordingly, it is clear that the surface oxide film is made of only Sn oxide in Comparative example 1; however, the surface oxide film is made of a mixture of Sn oxide and Zn oxide in Example 1 of the present invention.

Figure 6:
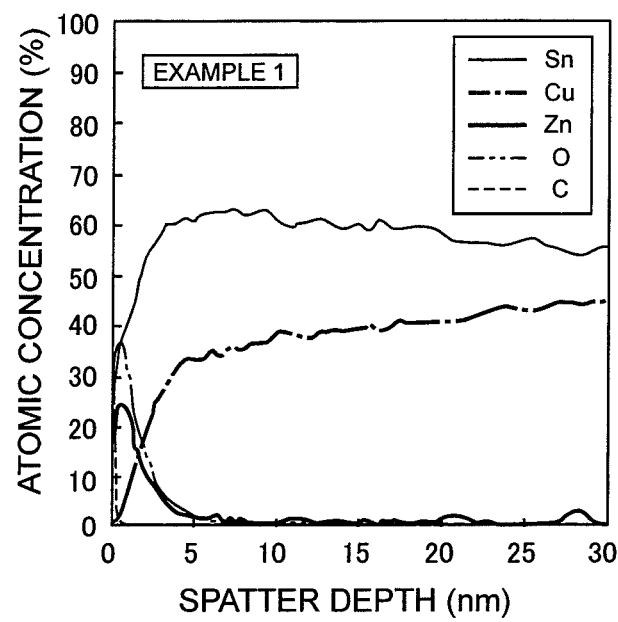
FIGS. 6(a) and 6(b) show results of AES (Auger electron spectroscopy) depth direction analysis of the surface oxide films and the Sn plating films according to Example 1 of the present invention and Comparative example 1, respectively.
Figure 6:
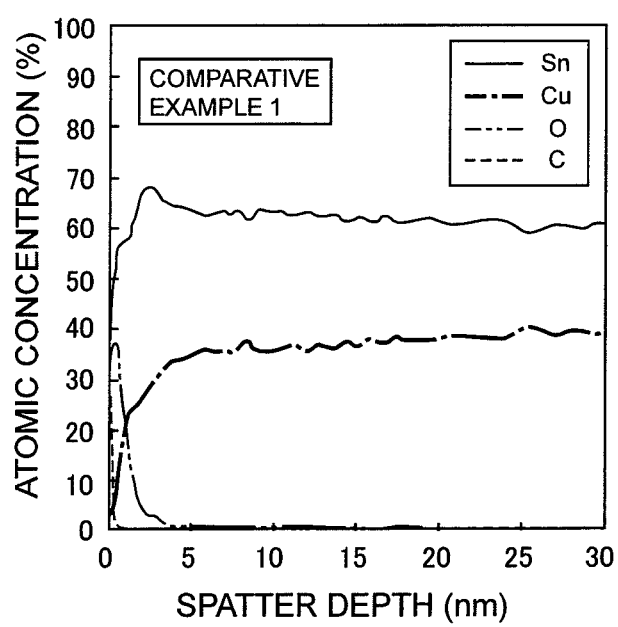

Next, the AES (Auger electron spectroscopy) depth direction analysis of the Sn-plated conductor in the terminal area of each FFC was carried out. The results of the analysis are shown in FIGS. 6(a) and 6(b). FIGS. 6(a) and 6(b) show results of AES depth direction analysis of the surface oxide films and the Sn plating films according to Example 1 of the present invention and Comparative example 1, respectively. When Example 1 in FIG. 6(a) is compared with Comparative example 1 in FIG. 6(b), the distribution of Sn, Cu, O, and C in the depth direction is almost the same, however, the peak of the Zn concentration can be recognized up to a depth of 5 nm only in Example 1.

Next, each FFC made of Example 1 and Comparative example 1 was joined to a connector and left undisturbed at room temperature for 250 hours. After that, the FFCs were removed from each connector and the contact points were observed by SEM, and the appearance frequency of a whisker with a length of 1 μm or more was measured. Table 2 shows the appearance frequency of whiskers together with the thickness of oxide film obtained from the results of the XPS analysis and the AES depth direction analysis.

TABLE 2

|  | Configuration of surface oxide film | Thickness of oxide film | Appearance frequency of whiskers |
|---|---|---|---|
| Example 1 | Sn oxide, Zn oxide | 2.7 nm | 7.6% |
| Comparative example 1 | Sn oxide | 2.5 nm | 22% |

As stated above, when Example 1 according to the present invention was compared with Comparative example 1, it was verified that the appearance frequency of whiskers could be reduced to approximately one third, which was from 22 to 7.6%.

Figure 7:
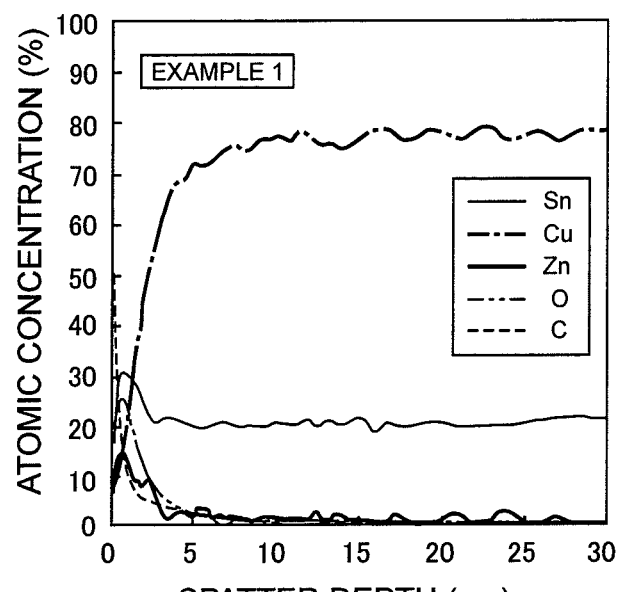
FIGS. 7(a) and 7(b) show results of AES depth direction analysis of the surface oxide films and the Sn plating films according to Example 1 of the present invention and Comparative example 1 after each conductor has been thermally treated at 150° C. for 24 hours, respectively.
Figure 7:
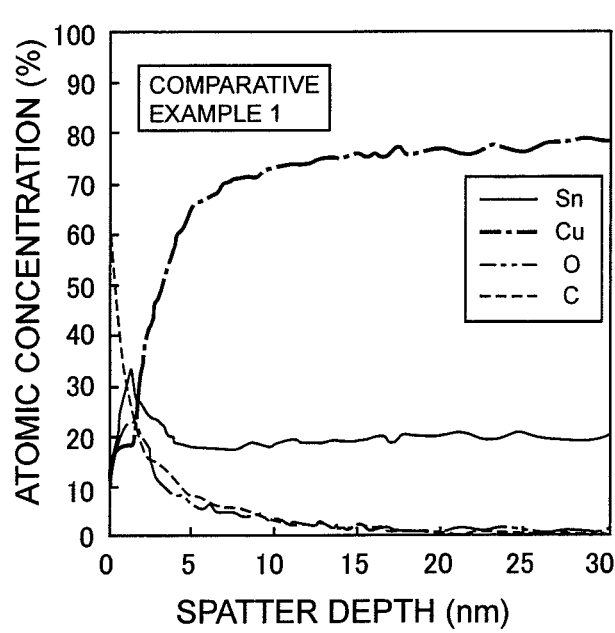

Furthermore, in order to compare the degree of progress of oxidation of the conductor surface by a thermal treatment, each FFC made of Example 1 and Comparative example 1 was thermally treated at 150° C. for 24 hours. After that, the AES depth direction analysis of the Sn plating in the terminal area of the FFC was carried out. The results are shown in FIGS. 7(a) and 7(b). FIGS. 7(a) and 7(b) show results of AES depth direction analysis of the surface oxide films and the Sn plating films according to Example 1 of the present invention and Comparative example 1 after each conductor has been thermally treated at 150° C. for 24 hours, respectively.

In Comparative example 1 in FIG. 7(b), when compared with the initial state in FIG. 6(b), the peak of the oxygen atom intrusion into the oxide film was initially 5 nm or less; however, thermal treatment caused oxygen atoms to intrude into the depth of 10 nm or more, making the oxide film thicker. On the contrary, in Example 1 of the present invention in FIG. 7(a), the peak of the initial oxygen atom intrusion into the oxide film was 5 nm or less, which did not change after the thermal treatment was executed, and the depth to which the oxygen atoms intruded did not change much from the initial state.

For this reason, in Example 1 of the present invention, it is strongly suggested that the surface oxide film does not grow much in the environment in which FFCs are usually used, and favorable whisker characteristics and contact resistance characteristics can be maintained.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A conductor for a flexible substrate, used for a flexible flat cable or disposed inside a flexible printed-circuit board, comprising:
   a base conductor made of Cu or Cu-alloy;
   a plated metal film made of Sn or Sn-alloy formed on a surface of the base conductor; and
   a surface oxide film formed directly on a surface of the plated metal film, wherein:
   the surface oxide film is made of an oxide comprising a mixture of Sn oxide and an oxide of an element other than Sn; and
   a thickness of the surface oxide film is equal to or less than 5 nm.

2. The conductor for a flexible substrate according to claim 1, wherein:
   the element other than Sn has higher oxidative tendency than Sn.

3. The conductor for a flexible substrate according to claim 1, wherein:
   the element other than Sn is at least one kind of element chosen from among Zn, P, Al, and Ti.

4. A flexible substrate, comprising:
   a plurality of conductors according to claim 1 arranged in parallel and an insulating layer provided on both sides of the plurality of conductors.

5. The flexible substrate according to claim 4, wherein:
   the insulating layer is made of resin film material having an adhesive layer at least on one side.

6. The conductor for a flexible substrate according to claim 1, wherein:
   the surface oxide film is made of an oxide comprising a mixture of Sn oxide and an oxide of Zn.

7. The conductor for a flexible substrate according to claim 1, wherein:
   the surface oxide film is made of an oxide comprising a mixture of Sn oxide and an oxide of P.

8. The conductor for a flexible substrate according to claim 1, wherein:
   the surface oxide film is made of an oxide comprising a mixture of Sn oxide and an oxide of Al.

9. The conductor for a flexible substrate according to claim 1, wherein:
   the surface oxide film is made of an oxide comprising a mixture of Sn oxide and an oxide of Ti.

10. The conductor for a flexible substrate according to claim 1, wherein:
    the surface oxide film is made of an oxide composed of a mixture of Sn oxide and an oxide of an element other than Sn.

11. The conductor for a flexible substrate according to claim 10, wherein:
    the element other than Sn has higher oxidative tendency than Sn.

12. The conductor for a flexible substrate according to claim 10, wherein:
    the element other than Sn is at least one kind of element chosen from among Zn, P, Al, and Ti.

13. The conductor for a flexible substrate according to claim 10, wherein:
    the surface oxide film is made of an oxide composed of a mixture of Sn oxide and an oxide of Zn.

14. The conductor for a flexible substrate according to claim 10, wherein:
    the surface oxide film is made of an oxide composed of a mixture of Sn oxide and an oxide of P.

15. The conductor for a flexible substrate according to claim 10, wherein:
    the surface oxide film is made of an oxide composed of a mixture of Sn oxide and an oxide of Al.

16. The conductor for a flexible substrate according to claim 10, wherein:
    the surface oxide film is made of an oxide composed of a mixture of Sn oxide and an oxide of Ti.

17. A flexible substrate, comprising:
    a plurality of conductors according to claim 10 arranged in parallel and an insulating layer provided on both sides of the plurality of conductors.

18. The flexible substrate according to claim 17, wherein:
    the insulating layer is made of resin film material having an adhesive layer at least on one side.

19. A fabrication method of a conductor for a flexible substrate, used for a flexible flat cable or disposed inside a flexible printed-circuit board, comprising steps of:
    forming a plating film made of Sn or Sn-alloy on a surface of a base conductor made of Cu or Cu-alloy; forming another plating layer made of at least one kind of element selected from among Zn, P, Al, and Ti on a surface of the plating film; and subsequently oxidizing the another plating layer and a surface region of the plating film by means of a reflow process, thereby forming a surface oxide film made of a mixture of Sn oxide and oxide of the selected element.

20. A fabrication method of a conductor for a flexible substrate, used for a flexible flat cable or disposed inside a flexible printed-circuit board, comprising steps of:
    forming an Sn-alloy plating film containing at least one kind of element selected from among Zn, P, Al, and Ti on a surface of a base conductor made of Cu or Cu-alloy; and subsequently oxidizing a surface region of the Sn-alloy plating film by means of a reflow process, thereby forming a surface oxide film made of a mixture of Sn oxide and oxide of the selected element.

* * * * *